(12) United States Patent
Nishiura et al.

(10) Patent No.: US 10,131,992 B2
(45) Date of Patent: Nov. 20, 2018

(54) SUBSTRATE PROCESSING APPARATUS, METHOD OF CONTROLLING SUBSTRATE PROCESSING APPARATUS, METHOD OF MAINTAINING SUBSTRATE PROCESSING APPARATUS, AND RECORDING MEDIUM

(71) Applicant: HITACHI KOKUSAI ELECTRIC INC., Tokyo (JP)

(72) Inventors: Susumu Nishiura, Toyama (JP); Kaori Inoshima, Toyama (JP); Hiroyuki Mitsui, Toyama (JP); Hiroshi Ekko, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 795 days.

(21) Appl. No.: 14/388,648

(22) PCT Filed: Mar. 22, 2013

(86) PCT No.: PCT/JP2013/058323
§ 371 (c)(1),
(2) Date: Sep. 26, 2014

(87) PCT Pub. No.: WO2013/146595
PCT Pub. Date: Oct. 3, 2013

(65) Prior Publication Data
US 2015/0096494 A1 Apr. 9, 2015

(30) Foreign Application Priority Data
Mar. 30, 2012 (JP) .................. 2012-082128

(51) Int. Cl.
C23C 16/52 (2006.01)
C23C 16/44 (2006.01)

(52) U.S. Cl.
CPC .......... *C23C 16/52* (2013.01); *C23C 16/4405* (2013.01)

(58) Field of Classification Search
CPC ...................... C23C 16/4405; C23C 16/52
See application file for complete search history.

(56) References Cited

U.S. PATENT DOCUMENTS

2003/0139835 A1   7/2003 Katsui et al.
2007/0215180 A1*  9/2007 Iijima ............... H01J 37/32862
                                                        134/18

FOREIGN PATENT DOCUMENTS

JP    11-243059 A      9/1999
JP    2000-297377 A   10/2000
(Continued)

OTHER PUBLICATIONS

Korean Notice of Preliminary Rejection, KR Application No. 10-2014-7026945, dated Nov. 10, 2015, 2 pgs. (English ranslation provided).

*Primary Examiner* — Dah-Wei D. Yuan
*Assistant Examiner* — Stephen A Kitt
(74) *Attorney, Agent, or Firm* — Volpe and Koenig, P.C.

(57) ABSTRACT

A substrate processing apparatus includes: an operation unit, which is provided with a storage unit that stores a plurality of recipes including a recipe for processing a member that constitutes the inside of a reactor in which substrate processing is performed, and a recipe for processing an exhaust pipe through which a gas released from the inside of the reactor flows, the operation unit further being provided with a display unit that displays a setting condition for executing the recipes on an operation screen; and a control unit that executes the recipe that meets the setting condition. The operation unit includes a recipe control unit, which controls, based on the setting condition, execution of the recipe for processing the member constituting the inside of the reactor (Continued)

in which the substrate processing is performed, and the recipe for processing the exhaust pipe, among the recipes stored in the storage unit.

10 Claims, 8 Drawing Sheets

(56) References Cited

FOREIGN PATENT DOCUMENTS

| | | | |
|---|---|---|---|
| JP | 2003-077838 | A | 3/2003 |
| JP | 2004-289098 | A | 10/2004 |
| JP | 3854157 | B2 | 9/2006 |
| JP | 2007-250791 | A | 9/2007 |
| JP | 2008-112919 | A | 5/2008 |
| JP | 4541739 | B2 | 7/2010 |

* cited by examiner

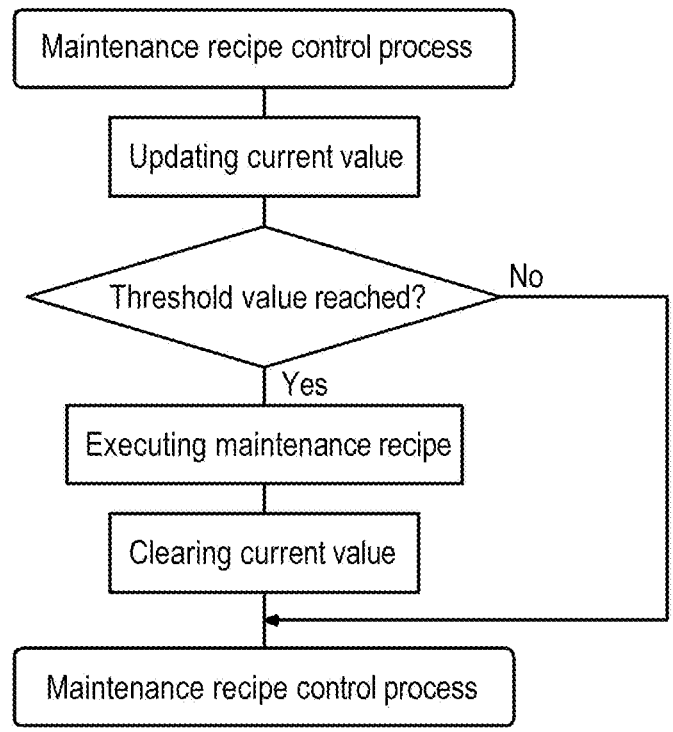

SUBSTRATE PROCESSING APPARATUS, METHOD OF CONTROLLING SUBSTRATE PROCESSING APPARATUS, METHOD OF MAINTAINING SUBSTRATE PROCESSING APPARATUS, AND RECORDING MEDIUM

TECHNICAL FIELD

The present disclosure relates to a recipe control for a substrate processing apparatus and, more particularly, to a maintenance recipe.

BACKGROUND

As a substrate processing apparatus for processing a substrate, a vertical batch-type substrate processing apparatus is used. The vertical batch-type substrate processing apparatus is configured such that a substrate holder for holding substrates in multiple stages is loaded into a reactor and a process gas is supplied into the reactor to process the substrates held by the substrate holder. In the vertical batch-type substrate processing apparatus, cumulative films deposited on members (e.g., a reaction tube, a substrate holder, etc.) constituting an inner part of a reactor are removed by executing a maintenance recipe. For example, Patent Document 1 discloses a technique in which a cleaning gas is supplied into a reaction tube to remove an attachment including a thin film attached to an inner wall of the reaction tube and the like. Patent Document 2 discloses removing a cumulative film deposited within a process chamber of a single-substrate-type substrate processing apparatus by executing a maintenance recipe on a condition that a thickness of the cumulative film reaches a threshold value.

Depending on a kind of a film formed on a surface of a substrate, it is sometimes a case that, in addition to the deposits adhering to members (e.g., a reaction tube, a substrate holder, etc.) constituting an inner part of a rector, a deposit adhering to an exhaust pipe is diffused into the reactor, thereby causing a contamination problem. Under the circumstances, an attempt has been made to efficiently remove the deposit adhering to the exhaust pipe. For example, Patent Document 3 discloses a technique in which an etching gas is allowed to flow into only an exhaust pipe to efficiently remove a byproduct adhering to an inner surface of the exhaust pipe.

RELATED ART DOCUMENTS

Patent Documents

Patent Document 1: Japanese Patent No. 4541739
Patent Document 2: Japanese Patent No. 3854157
Patent Document 3: Japanese laid-open publication No. 11-243059

The present disclosure provides some embodiments of a substrate processing apparatus in which respective recipes differing in cleaning target regions and cleaning target members from one another are controlled under a cleaning condition set based on at least a cumulative film thickness value such that a suitable recipe is selected and executed, a method for controlling a substrate processing apparatus, a method for maintaining a substrate processing apparatus, and a recording medium.

SUMMARY

According to one embodiment of the present disclosure, there is provided a substrate processing apparatus, including a storage unit configured to store a plurality of recipes including a recipe for processing a member constituting an inner part of a reactor in which substrate processing is performed and a recipe for processing an exhaust pipe through which a gas exhausted from the reactor flows, an operation unit including a display unit configured to display a setting condition for executing the recipes on an operation screen, and a control unit configured to execute a recipe that meets the setting condition, wherein the operation unit includes a recipe control unit configured to control, based on the setting condition, execution of each of the recipe for processing the member constituting the inner part of the reactor in which the substrate processing is performed and the recipe for processing the exhaust pipe, among the recipes stored in the storage unit.

According to another embodiment of the present disclosure, there is provided a method of controlling a substrate processing apparatus that includes a storage unit configured to store a plurality of recipes including a recipe for processing a member constituting an inner part of a reactor in which substrate processing is performed and a recipe for processing an exhaust pipe through which a gas exhausted from the reactor flows, an operation unit including a display unit configured to display a setting condition for executing the recipes on an operation screen, and a control unit configured to execute a recipe that meets the setting condition, wherein the operation unit includes a recipe control unit configured to control, based on the setting condition, execution of each of the recipe for processing the member constituting the inner part of the reactor in which the substrate processing is performed and the recipe for processing the exhaust pipe, among the recipes stored in the storage unit.

According to still another embodiment of the present disclosure, there is provided a method of maintaining a substrate processing apparatus that includes a control unit configured to execute maintenance recipes including a recipe for processing a member constituting an inner part of a reactor in which substrate processing is performed and a recipe for processing an exhaust pipe through which a gas exhausted from the reactor flows, wherein the control unit is configured to execute a step of updating a condition defined in a setting condition for executing the maintenance recipes, a step of comparing a current value of the updated condition with a threshold value defined in the setting condition, a step of selecting, upon the comparing, a maintenance recipe which has reached the threshold value, among the maintenance recipes stored in a storage unit, and a step of clearing the current value after the selected maintenance recipe is executed.

According to still another embodiment of the present disclosure, there is provided a non-transitory computer-readable recording medium that records a recipe control program which includes a step of updating a condition defined in a setting condition for executing maintenance recipes, a step of comparing a current value of the updated condition with a threshold value defined in the setting condition, a step of executing, upon the comparing, a maintenance recipe which has reached the threshold value, among the maintenance recipes stored in a storage unit, and a step of clearing the current value of the executed maintenance recipe.

According to the present disclosure, the execution of the respective maintenance recipes individually prepared depending on cleaning target regions and cleaning target members can be controlled such that a suitable maintenance recipe is executed. This makes it possible to enhance maintenance efficiency.

BRIEF DESCRIPTION OF THE DRAWINGS

FIG. 5 is a view showing a maintenance recipe control flow according to one embodiment (example 1) of the present disclosure.

FIG. 6 is a view showing an exemplary screen for setting maintenance recipes according to one embodiment (example 1) of the present disclosure.

DETAILED DESCRIPTION

Embodiments of the present disclosure will now be described in detail with reference to the accompanying drawings.

Figure 1:
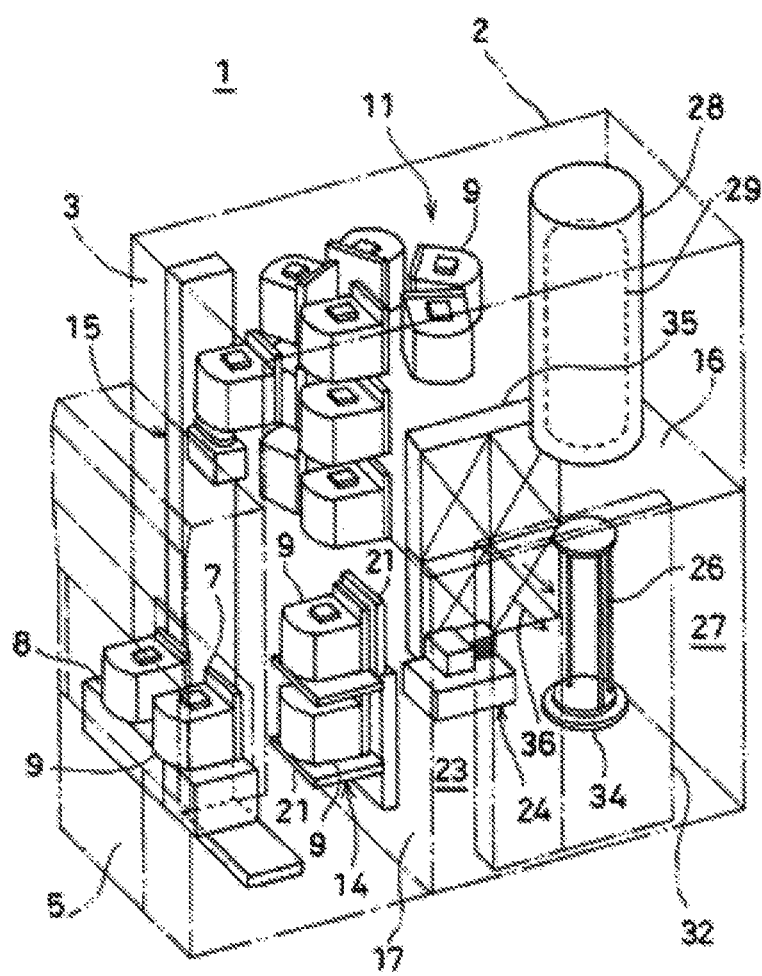
FIG. 1 is a perspective view showing a substrate processing apparatus according to the present disclosure.
Figure 2:
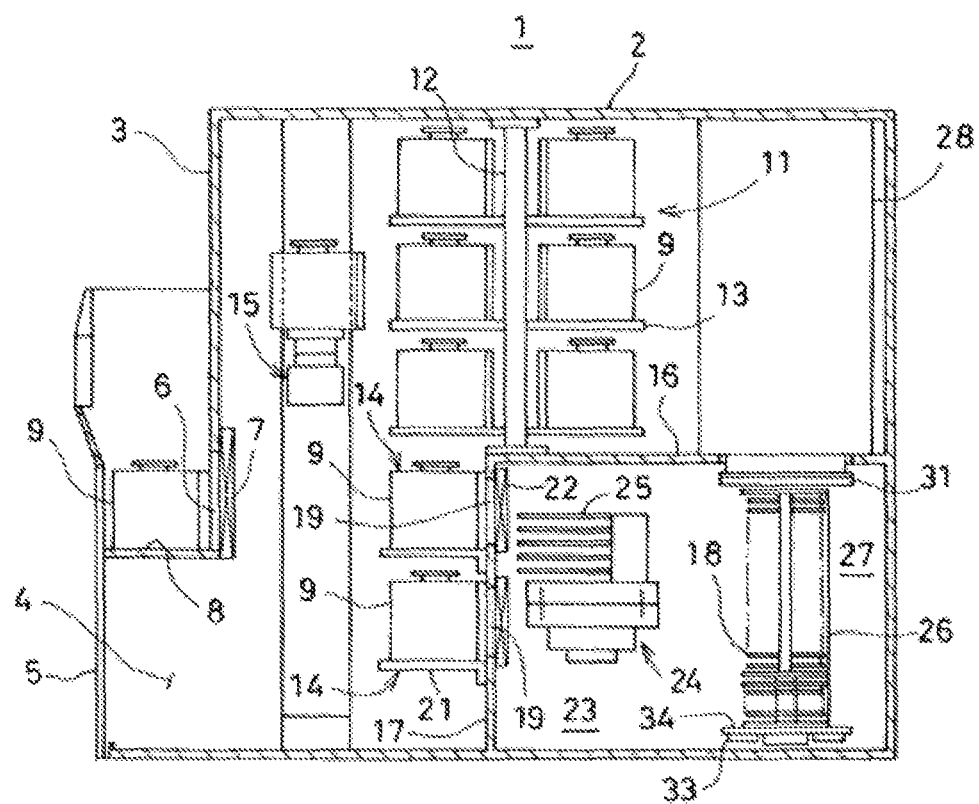
FIG. 2 is a side sectional view showing the substrate processing apparatus according to the present disclosure.

Referring first to FIGS. 1 and 2, description will be made on a substrate processing apparatus by which the present disclosure is implemented.

FIGS. 1 and 2 show a vertical substrate processing apparatus as one example of a substrate processing apparatus. As an example of a substrate processed in the substrate processing apparatus, a wafer made of silicon and the like is shown.

The substrate processing apparatus 1 includes a housing 2. A front maintenance gate 4 as an opening formed for maintenance purposes is installed in a lower portion of a front wall 3 of the housing 2. The front maintenance gate 4 is opened and closed by a front maintenance door 5.

A pod loading/unloading gate 6 is installed in the front wall 3 of the housing 2 so as to bring an inside and an outside of the housing 2 to communicate with each other. The pod loading/unloading gate 6 is opened and closed by a front shutter (or loading/unloading gate opening/closing mechanism) 7. A load port (or substrate conveyance container delivering stand) 8 is installed at a front side of the pod loading/unloading gate 6. The load port 8 is configured to align the position of a pod 9 mounted thereon.

The pod 9 is a sealed substrate conveyance container. The pod 9 is loaded onto the load port 8 by an in-process conveyance device (not shown) and is unloaded from the load port 8 by the conveyance device.

A rotary pod rack (or substrate conveyance container storing rack) 11 is installed in an upper portion of a substantially central region within the housing 2 in a front-rear direction. The rotary pod rack 11 is configured to store a plurality of pods 9.

The rotary pod rack 11 includes a post 12 which is installed upright and intermittently rotated, and a plurality of rack plates (or substrate conveyance container mounting shelves) 13 radially supported by the post 12 in upper, middle and lower positions. Each of the rack plates 13 is configured to hold and store a plurality of pods 9.

Pod openers (or substrate conveyance container lid opening/closing mechanisms) 14 are installed below the rotary pod rack 11. Each of the pod openers 14 is configured to mount the pod 9 thereon and to open and close the lid of the pod 9.

A pod conveyance mechanism (or container conveyance mechanism) 15 is installed between the load port 8, the rotary pod rack 11, and the pod openers 14. The pod conveyance mechanism 15 is configured to hold the pod 9 and may be moved in a vertical direction and in a horizontal direction. The pod conveyance mechanism 15 is configured to convey the pod 9 between the load port 8, the rotary pod rack 11 and the pod openers 14.

A sub housing 16 is installed in a lower portion of a substantially central region within the housing 2 in a front-rear direction so as to reach a rear end portion of the housing 2. A pair of wafer loading/unloading gates (or substrate loading/unloading gates) 19 for loading and unloading wafers (or substrates) 18 into and from the sub housing 16 is arranged and installed in a front wall 17 of the sub housing 16 at two stages along a vertical direction. The pod openers 14 are installed to correspond to upper and lower wafer loading/unloading gates 19, respectively.

Each of the pod openers 14 includes a mounting stand 21 for mounting the pod 9 thereon and an opening/closing mechanism 22 for opening and closing the lid of the pod 9. In each of the pod openers 14, the lid of the pod 9 mounted on the mounting stand 21 is opened and closed by the opening/closing mechanism 22 such that a wafer entrance of the pod 9 is opened and closed.

The sub housing 16 defines a transfer chamber 23 which is air-tightly isolated from a space (or pod conveyance space) where the pod conveyance mechanism 15 and the rotary pod rack 11 are disposed. A wafer transfer mechanism (or substrate transfer mechanism) 24 is installed in a front region of the transfer chamber 23. The wafer transfer mechanism 24 includes a predetermined number of (e.g., five as illustrated) wafer mounting plates 25 for mounting the wafers 18 thereon. The wafer mounting plates 25 can be linearly driven in a horizontal direction, rotated in the horizontal direction, and moved in a vertical direction. The wafer transfer mechanism 24 is configured to charge and discharge the wafers 18 to and from a boat (or substrate holder) 26.

A waiting part 27 for accommodating the boat 26 therein and keeping the boat 26 on standby is arranged in a rear region of the transfer chamber 23. A vertical processing furnace 28 is installed in an upper portion of the waiting part 27. A processing chamber 29 is defined within the processing furnace 28. A furnace mouth is formed in a lower end portion of the processing chamber 29. The furnace mouth is opened and closed by a furnace mouth shutter (or furnace mouth opening/closing mechanism) 31.

A boat elevator (or substrate holder elevating mechanism) 32 for moving the boat 26 up and down is installed between a right end portion of the housing 2 and a right end portion of the waiting part 27 of the sub housing 16. A seal cap 34 as a cover is horizontally installed in an arm 33 connected to an elevating stand of the boat elevator 32. The seal cap 34 is configured to vertically support the boat 26 and to air-tightly close the furnace mouth with the boat 26 loaded into the processing chamber 29.

The boat 26 is configured to hold a plurality of (e.g., about 50 to 125) wafers 18 in a horizontal posture at multiple stages with the wafers 18 aligned along the center of the boat 26.

A clean unit 35 is arranged in a position opposing to the boat elevator 32. The clean unit 35 includes a supply fan and a dust-proof filter so as to supply a clean air 36 as a purified gas, an inert gas, or the like. A notch aligning device (not shown) as a substrate matching device for matching a circumferential position of each of the wafers 18 is installed between the wafer transfer mechanism 24 and the clean unit 35.

The clean air 36 sprayed from the clean unit 35 flows through the notch aligning device (not shown), the wafer transfer mechanism 24 and the boat 26. Thereafter, the clean air 36 is drawn into a duct (not shown) and is exhausted out of the housing 2 or sprayed into the transfer chamber 23 by the clean unit 35.

Next, description will be made on operations of the substrate processing apparatus 1.

If the pod 9 is provided to the load port 8, the pod loading/unloading gate 6 is opened by the front shutter 7. The pod 9 mounted on the load port 8 is loaded into the housing 2 through the pod loading/unloading gate 6 by the pod conveyance mechanism 15 and is mounted on a designated one of the rack plates 13 of the rotary pod rack 11. After the pod 9 is temporarily held in the rotary pod rack 11, the pod 9 is conveyed by the pod conveyance mechanism 15 from the rack plate 13 to one of the pod openers 14 and is transferred to and mounted on the mounting stand 21. Alternatively, the pod 9 may be directly transferred to and mounted on the mounting stand 21 from the load port 8.

At this time, the wafer loading/unloading gates 19 is closed by the opening/closing mechanism 22 and the transfer chamber 23 is filled with the clean air 36 which has been flown into the transfer chamber 23. For example, the transfer chamber 23 is filled with a nitrogen gas as the clean air 36, whereby an oxygen concentration in the transfer chamber 23 is set at 20 ppm or less, which is far lower than an oxygen concentration within the housing 2 (e.g., in an air atmosphere).

An opening-side end surface of the pod 9 mounted on the mounting stand 21 is pressed against a peripheral edge portion of one of the wafer loading/unloading gates 19 formed in the front wall 17 of the sub housing 16. The lid of the pod 9 is removed by the opening/closing mechanism 22. With such configuration, the wafer entrance of the pod 9 is opened.

If the pod 9 is opened by the pod opener 14, the wafer 18 is taken out from the pod 9 by the wafer transfer mechanism 24. The wafer 18 is conveyed to and matched by the notch aligning device (not shown). Thereafter, the wafer transfer mechanism 24 carries the wafer 18 into the waiting part 27 arranged at a back side of the transfer chamber 23 and charges the wafer 18 into the boat 26.

The wafer transfer mechanism 24 that has delivered the wafer 18 to the boat 26 returns back to the pod 9 and charges the subsequent wafer 18 into the boat 26.

On the other hand, while the wafer 18 is charged into the boat 26 by the wafer transfer mechanism 24 via one (e.g., upper or lower) pod opener 14, another pod 9 is conveyed from the rotary pod rack 11 to the other (e.g., lower or upper) pod opener 14 by the pod conveyance mechanism 15. With such a configuration, an opening operation of the pod 9 using the other pod opener 14 may be performed at the same time.

If a predetermined number of wafers 18 are charged into the boat 26, the furnace mouth of the processing furnace 28 which was kept closed by the furnace mouth shutter 31 is opened by the furnace mouth shutter 31. Subsequently, the boat 26 is moved up by the boat elevator 32 and is carried (or loaded) into the processing chamber 29.

After such loading operation, the furnace mouth is air-tightly closed by the seal cap 34. In the present embodiment, at this timing (i.e., after the loading operation), a purge step (pre-purge step) in which an internal atmosphere of the processing chamber 29 is substituted by an inert gas is performed.

The processing chamber 29 is evacuated by a gas exhaust mechanism (not shown) such that the processing chamber 29 has a desired pressure (or desired vacuum degree). Furthermore, the processing chamber 29 is heated to a specified temperature by a heater drive unit (not shown) such that the processing chamber 29 has a desired temperature distribution.

A process gas controlled to have a specified flow rate is supplied by a gas supply mechanism (not shown). While flowing into the inside the processing chamber 29, the process gas makes contact with surfaces of the wafers 18. Thus, specified processing is performed on the surfaces of the wafers 18. The reacted process gas is discharged from the processing chamber 29 by the gas exhaust mechanism.

If a predetermined processing time elapses, an inert gas is supplied from an inert gas supply source (not shown) by the gas supply mechanism. In such a manner, the internal atmosphere of the processing chamber 29 is replaced by the inert gas and the pressure of the processing chamber 29 is returned to a normal pressure (after-purge step). Then, the boat 26 is moved down by the boat elevator 32 via the seal cap 34.

When unloading the processed wafers 18, the wafers 18 and the pod 9 are discharged out of the housing 2 in an order opposite to the order described above. The wafers 18 which have not yet been processed are charged to the boat 26 and the batch processing of the wafers 18 is repeated.

Figure 3:
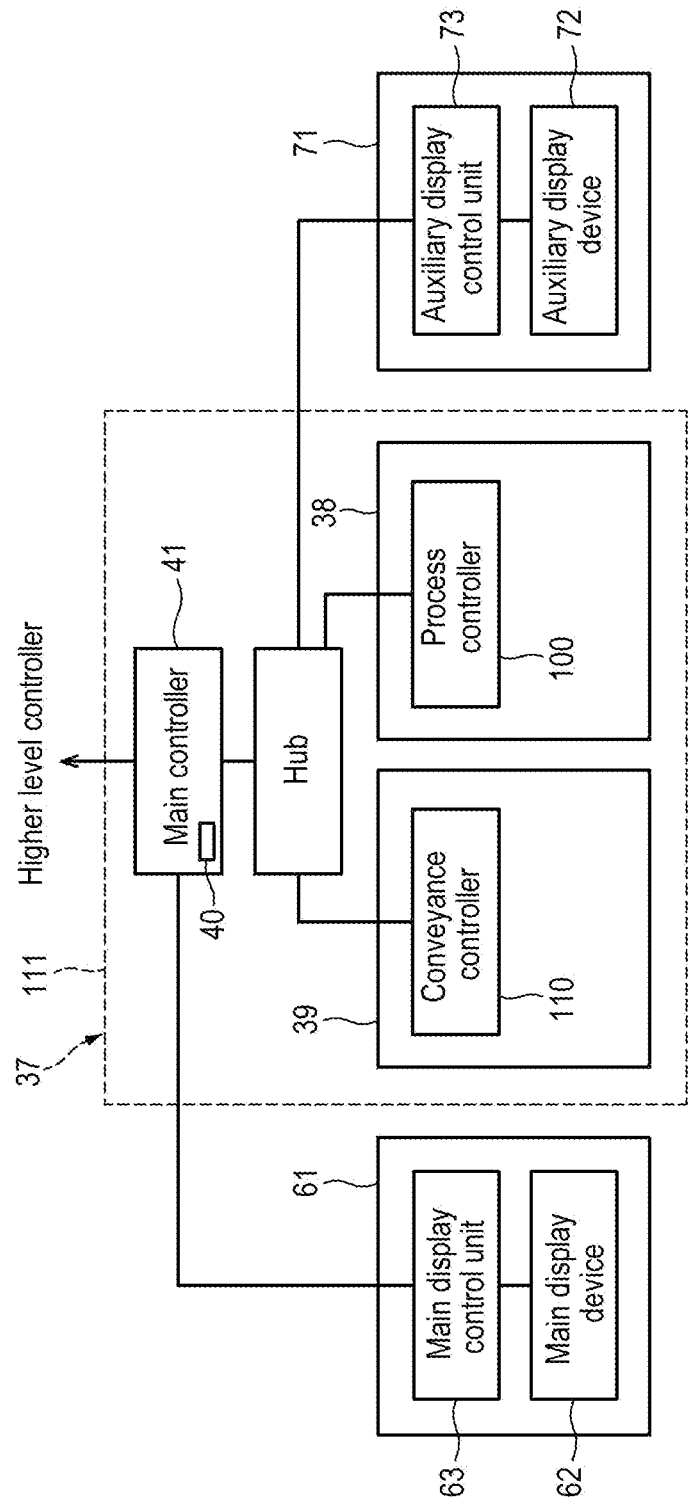
FIG. 3 is a block diagram showing a control system employed in the substrate processing apparatus according to the present disclosure.
Figure 4:
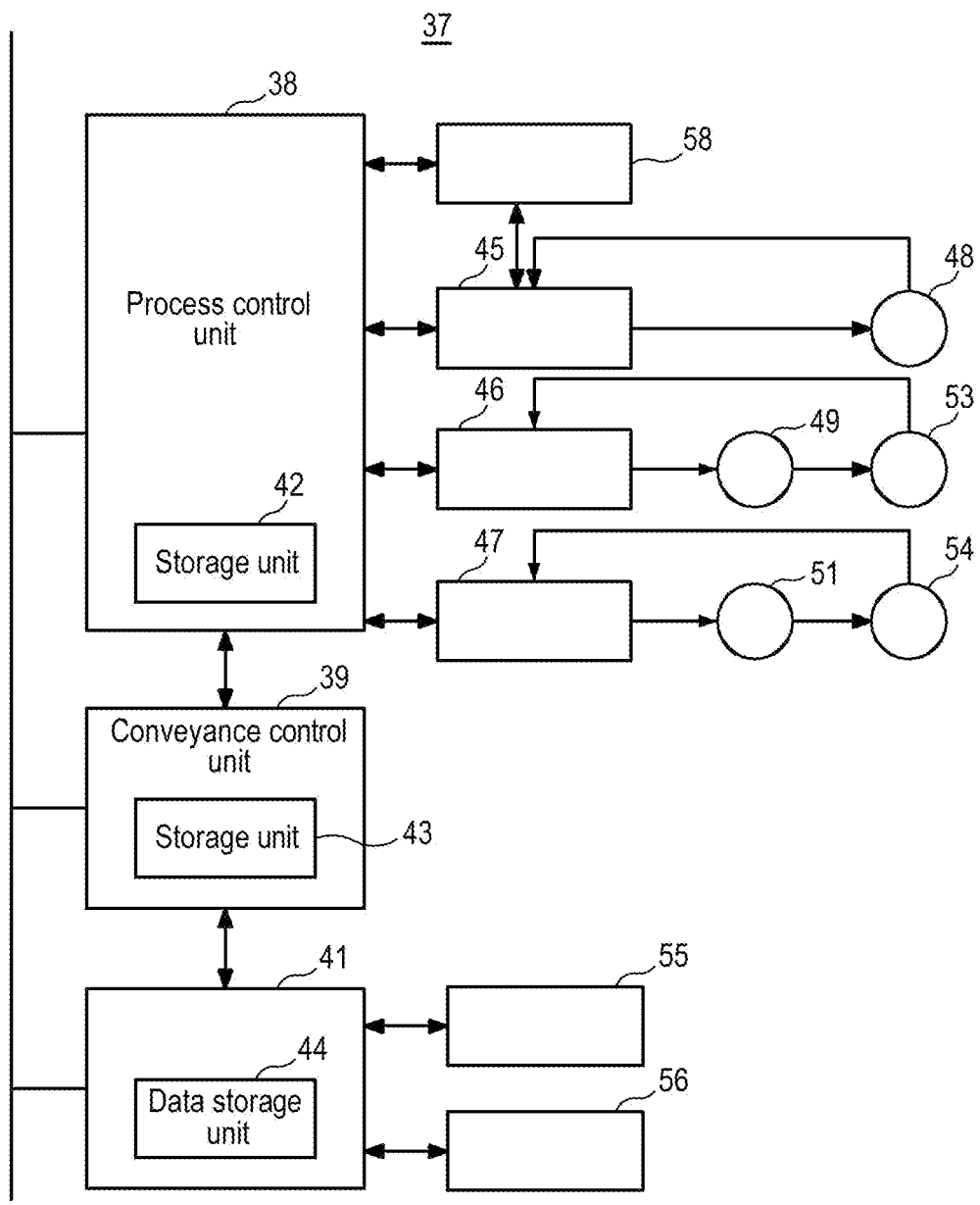
FIG. 4 is a block diagram showing details of the control system employed in the substrate processing apparatus according to the present disclosure.

The processing furnace 28, the conveyance mechanism including at least the pod conveyance mechanism 15 as a mechanism for conveying substrates, the wafer transfer mechanism 24 and the boat elevator 32, the gas supply mechanism for supplying a process gas, and the like to the processing furnace 28, the gas exhaust mechanism for evacuating the inside of the processing furnace 28, the heater drive unit for heating the processing furnace 28 to a predetermined temperature, and a control device 37 for controlling the processing furnace 28, the conveyance mechanism, the gas supply mechanism, the gas exhaust mechanism and the heater drive unit will now be described with reference to FIGS. 3 and 4.

Next, a hardware configuration with a focus on the apparatus controller 37 as the control device of the substrate processing apparatus 1 will be described with reference to FIG. 3. As shown in FIG. 3, the apparatus controller 37 includes a main controller 41 as an operation unit, a conveyance control unit 39 and a process control unit 38, all of which are installed within a substrate processing apparatus body 111. In this regard, the conveyance control unit 39 and the process control unit 38 may not be installed within the substrate processing apparatus body 111 but may be installed outside the substrate processing apparatus body 111.

The main controller 41 as a main operation unit is connected via, for example, a video cable, a network, a LAN or the like, to a main operation device 61 as an input/output unit including an input unit and a display unit combined together. The main controller 41 may be connected to an external operation device (not shown) via, for example, a communication network. In this case, the external operation device can be arranged in a position spaced apart from the substrate processing apparatus 1. For example, if the substrate processing apparatus 1 is installed within a clean room, the external operation device can be arranged in an office or other place outside the clean room. The main controller 41 includes a port 40 as an attachment/removal portion for use in attaching and removing a USB flash memory which is a recording medium as an external memory device.

A main operation device 61 is arranged in the vicinity of the substrate processing apparatus 1 (or the processing furnace 28, the substrate processing apparatus body 111). In the present embodiment, the main operation device 61 is provided in the substrate processing apparatus body 111 and is integrally fixed to the substrate processing apparatus 1. Such an arrangement of the main operation device 61 in the vicinity of the substrate processing apparatus 1 (or the processing furnace 28, the substrate processing apparatus body 111), may mean that the main operation device 61 is disposed at a position where an operator can check a state of the substrate processing apparatus 1. For example, the main operation device 61 is arranged within the clean room where the substrate processing apparatus body 111 is installed. The main operation device 61 includes a main display device 62. The main display device 62 is, for example, a liquid crystal display panel and is configured to display an operation screen for use in operating the substrate processing apparatus 1. The main operation device 61 can allow the operation screen to display information generated in the substrate processing apparatus 1 and can output the displayed information to a USB flash memory inserted into the port 40.

An auxiliary operation device 71 includes an auxiliary display device 72. Similar to the main display device 62, the auxiliary display device 72 is, for example, a liquid crystal display panel and is configured to display an operation screen for use in operating the substrate processing apparatus 1. The operation screen displayed by the auxiliary display device 72 has the same function as the operation screen displayed by the main display device 62. Accordingly, the auxiliary operation device 71 can allow the operation screen to display various kinds of information generated in the substrate processing apparatus 1 and can output the displayed information to a USB flash memory inserted into the port 40.

As shown in FIG. 3, a main display control unit 63 used for controlling the display operation of the main display device 62 is installed within the main operation device 61. The main display control unit 63 is connected to the main controller 41 via, for example, a video cable or the like.

As illustrated in FIG. 3, an auxiliary display control unit 73 used for controlling the display operation of the auxiliary display device 72 is installed within the auxiliary operation device 71. The auxiliary display control unit 73 is not limited to the illustrated configuration and may be connected to the main controller 41 via a communication network or the like.

The process control unit 38 includes a process controller 100 which is configured by a computer composed of, for example, a CPU (Central Processing Unit) or the like. The conveyance control unit 39 includes a conveyance controller 110 which is configured by a computer composed of, for example, a CPU or the like. The conveyance controller 110 and the process controller 100 are respectively connected to the main controller 41 through a switching hub. The computer referred to herein is configured to execute a program to thereby perform designated information processing based on the program. Specifically, the computer is configured by the combination of a CPU, a memory and an input/output device.

Details of a control system with a focus on the apparatus controller 37 of the present embodiment will be described below with reference to FIG. 4.

In FIG. 4, reference symbol 38 designates a process control module as a process control unit. Reference symbol 39 designates a conveyance control unit. Reference symbol 41 designates an operation unit. The process control unit 38 includes a storage unit 42. The storage unit 42 stores a process execution program required for executing a process, information fed back from a storage region for storing monitor information including at least valve opening/closing information acquired from a sequencer 45 as an input/output control unit and gas flow rate information acquired from an MFC 58 as a flow rate control unit, and information fed back from the sequencer 45. The conveyance control unit 39 includes a storage unit 43 which stores a conveyance program for executing conveyance of the wafers 18. The operation unit 41 includes a data storage unit 44 which is composed of an external storage device such as, for example, an HDD. Various kinds of programs such as a process execution program and a conveyance program are stored in the data storage unit 44.

The process control unit 38 includes the sequencer 45 as an input/output control unit, a heating control unit 46, a pressure control unit 47 and an MFC 58 as a flow rate control unit. The process control unit 38 controls operations of actuators for executing respective process steps. For example, the process control unit 38 controls operations of the sequencer 45 and the MFC 58, thereby controlling a flow rate of a process gas supplied to the processing furnace 28. The heating control unit 46 controls the heating of the processing furnace 28. The pressure control unit 47 is configured to control an exhaustion of a gas from the processing furnace 28 or a pressure of the processing furnace 28. Reference symbol 49 designates a heater controlled by the heating control unit 46. Reference symbol 51 designates a pressure valve controlled by the pressure control unit 47. Reference symbol 48 designates a valve whose opening and closing are controlled by an input/output control unit 45. More specifically, the valve 48 is on/off controlled to thereby control the supply and cutoff of a process gas. Reference symbol 58 designates an MFC (or flow rate controller) controlled by the process control unit 38.

Reference symbol 53 designates a temperature detector as a temperature detecting unit. Reference symbol 54 designates a pressure sensor as a pressure detecting unit. The temperature detector 53 is configured to detect a state of the heater 49 and feedback a detection result to the heating control unit 46. The pressure sensor 54 is configured to detect a state of the pressure valve 51 and feedback a detection result to the pressure control unit 47. The valve 48 controls the supply and cutoff of a process gas. An electromagnetic valve (not shown) annexed to the valve 48 detects an opening/closing state of the valve 48 and feedbacks a detection result to the input/output control unit 45. The MFC 58 feedbacks attribute information including not only flow rate information but also various kinds of other information to the process control unit 38.

Reference symbol 55 designates an input unit such as a keyboard, a mouse or the like. Reference symbol 56 designates a display unit such as a monitor or the like. While the input unit 55 and the display unit 56 are independently illustrated in the figure, it may be possible to employ a display unit provided with an input unit, such as a touch panel in which an input operation can be performed on a screen.

Instructions to set values or command signals corresponding to process sequences are inputted from the process control unit 38 to the input/output control unit 45, the heating control unit 46 and the pressure control unit 47. The process control unit 38 collectively controls the input/output control unit 45, the MFC 58 as a flow rate controller, the heating control unit 46 and the pressure control unit 47 based on detection results detected by the electromagnetic valve, the temperature detector 53 and the pressure sensor 54.

The process control unit 38 executes substrate processing in response to a command inputted from the input unit 55 through the operation unit 41. Pursuant to the program stored in the storage unit 42, the process control unit 38 executes a substrate processing independently of other control systems. With such configuration, even if trouble occurs in the conveyance control unit 39 or the operation unit 41, the conveyance of the wafers 18 is not stopped and may be successfully accomplished.

In response to a command inputted from the input unit 55 through the operation unit 41, the conveyance control unit 39 drives the pod conveyance mechanism 15, the wafer transfer mechanism 24 and the boat elevator 32, thereby executing the conveyance of the wafers 18. Pursuant to the conveyance program stored in the storage unit 43, the conveyance of the wafers 18 is executed independently of other control systems. With such configuration, even if trouble occurs in the process control unit 38 or the operation unit 41, the conveyance of the wafers 18 is not stopped and may be successfully accomplished.

In addition to the aforementioned programs, various kinds of other programs such as a program for governing progress of substrate processing, a setting program for setting process conditions, a communication program for transmitting and receiving data to and from the process control unit 38 and the conveyance control unit 39 through a communication unit such as a LAN or the like, a display program for displaying states of the input/output control unit 45, the heating control unit 46 and the pressure control unit 47 on the display unit 56, and an operation program for editing parameters required for controlling operations of the flow rate controller 58, the input/output control unit 45, the heating control unit 46 and the pressure control unit 47 are stored as files in the data storage unit 44. Moreover, a recipe (or process recipe) for the substrate processing, a maintenance recipe including a cleaning recipe, an alarm recipe executed upon generation of an alarm, and various kinds of parameters included in these recipes, are properly stored as files in the data storage unit 44.

The data storage unit 44 includes a data storage region in which parameters required in the substrate processing are stored. Information such as setting values, the detection results, the processing states, and the like of each of the valve 48, the temperature detector 53 and the pressure sensor 54 may be stored in the storage region of the data storage unit 44 according to time.

(Substrate Processing Method)

Subsequently, description will be made on a substrate processing method implemented using the substrate processing apparatus 1 according to the present embodiment. Taken as an example here is a case where a substrate processing step as one step of a semiconductor device manufacturing process is executed.

When executing the substrate processing step, a recipe corresponding to the substrate processing to be implemented is first read out from the storage unit 42 and is loaded into a memory such as a RAM (Random Access Memory) or the like arranged within the main controller 41. If necessary, an operation instruction is given from the main controller 41 to the process controller 100 and the conveyance controller 110. The substrate processing step executed in such a manner includes, when largely divided, a transfer step, a loading step, a film forming step, a boat conveyance step and an unloading step.

(Transfer Step)

An operation instruction of the wafer transfer mechanism 24 is issued from the main controller 41 to the conveyance controller 110. In response to an instruction transmitted from the conveyance controller 110, the wafer transfer mechanism 24 starts a transfer process by which the wafers 18 are transferred from the pod 9 on the delivery stage 21 as a mounting stand to the boat 26. The transfer process is performed until the charging of all the wafers 18 to the boat 26 (i.e., wafer charging) is finished.

(Loading Step)

If a predetermined number of wafers 18 is charged to the boat 26, the boat 26 is moved up by the boat elevator 32 that operates in response to an instruction transmitted from the conveyance controller 110 and is loaded into the processing chamber 29 formed inside the an inner tube of the processing furnace 28 (i.e., boat loading). If the boat 26 is completely loaded, the seal cap 34 of the boat elevator 32 air-tightly closes a lower end portion of a manifold of the processing furnace 28.

(Film Forming Step)

Thereafter, in response to an instruction transmitted from the pressure control unit 47, the inside of the processing chamber 29 is evacuated by a vacuum exhaust device to a predetermined film forming pressure (or vacuum degree). At this time, an internal pressure of the processing chamber 29 is measured by the pressure sensor 54. A pressure regulating device is feedback controlled based on the pressure information thus measured. In response to an instruction transmitted from the heating control unit 46, the inside of the processing chamber 29 is heated to a predetermined temperature by the heater 49. At this time, the power supplied to the heater 49 is feedback controlled, based on the temperature information detected by the temperature sensor 53 as a temperature detector, such that the internal temperature of the processing chamber 29 becomes a predetermined temperature (e.g., film forming temperature). Subsequently, in response to an instruction transmitted from the conveyance controller 110, a rotating mechanism begins to rotate the boat 26 and the wafers 18.

For example, an $SiH_2Cl_2$ gas as a silicon-containing gas into the processing chamber 29 is started to be supplied in a state in which the inside of the processing chamber 29 is kept at a predetermined film forming temperature and at a predetermined film forming pressure.

At this time, an $N_2$ gas supplied into the processing chamber 29 serves as a diluting gas that dilutes a film forming gas (e.g., $SiH_2Cl_2$ gas), or a carrier gas that activates diffusion of the film forming gas (e.g., $SiH_2Cl_2$ gas) into the processing chamber 29. A concentration and diffusion speed of the film forming gas (e.g., $SiH_2Cl_2$ gas) can be controlled by adjusting a supply flow rate of the $N_2$ gas.

The film forming gas (e.g., $SiH_2Cl_2$ gas) supplied into the processing chamber 29 makes contact with a surface of the wafer 18 while flowing through the inside of the processing chamber 29. At this time, a thin film, that is, a poly-silicon film (a poly-Si film, which will be simply referred to as an Si film in some cases), is deposited on the surface of the wafer 18 by a thermal CVD reaction. If the Si film having a predetermined film thickness is formed as a predetermined processing time elapses, the valve is closed to stop the supply of the film forming gas (e.g., $SiH_2Cl_2$ gas) into the processing chamber 29.

Thereafter, while continuously supplying the $N_2$ gas into the processing chamber 29, the inside of the processing chamber 29 is evacuated and consequently purged. If an internal atmosphere of the processing chamber 29 is substituted by the $N_2$ gas, an internal pressure of the processing chamber 29 is returned to a normal pressure by adjusting an opening degree of the pressure valve 51 as a pressure regulating device. Furthermore, the power supply to the heater 49 is stopped to thereby reduce the internal temperature of the processing chamber 29 to a predetermined temperature (e.g., wafer unloading temperature).

(Unloading Step)

If the film forming step for the boat 26 is completed, the rotation of the boat 26 and the wafers 18 performed by the rotating mechanism is then stopped in response to an instruction transmitted from the conveyance controller 110. The seal cap 34 is moved down by the boat elevator 32 to thereby open the lower end portion of the manifold. The boat 26 that holds processed wafers 18 is unloaded out of the processing chamber 29 (i.e., boat unloading).

The boat 26 holding the processed wafers 18 is effectively cooled by the clean air 36 sprayed from the clean unit 35. If the boat 26 is cooled to, for example, 150 degree C. or less, the processed wafers 18 are discharged from the boat 26 (i.e., wafer discharging) and are transferred to the pod 9. Thereafter, a transfer of the boat 26 holding new wafers 18 which have not yet been processed is performed.

By repeating the respective steps described above, the substrate processing apparatus 1 according to the present embodiment can form a silicon film on each of the wafers 18 at a high throughput.

(Method for Maintaining Substrate Processing Apparatus)

The aforementioned film forming step is executed for the purpose of forming films on the wafers 18. In reality, however, films are formed on other parts than the wafers 18, for example, the reaction tube defining the processing chamber 29, the boat 26 and the like. If the thickness of the films thus formed and deposited increases, cracks may occur on the films due to an increased amount of stresses applied. It is sometimes the case that foreign substances (or particles) are generated within the processing chamber 29. For that reason, if the thickness of the film deposited on an inner part of the processing chamber 29 or other parts reaches a predetermined thickness as the aforementioned film forming step is repeated, the substrate processing apparatus 1 according to the present embodiment executes a cleaning step described below, as a maintenance step for maintaining the inner part of the processing chamber 29 and other parts.

(Cleaning Step)

An execution of the cleaning step is started when the thickness of a deposit (or cumulative thin film) adhering to the inner part of the processing chamber 29 or other parts reaches a predetermined thickness before the deposits gets separated and dropped. Whether the thickness of the cumulative film reaches the predetermined thickness may be determined based on, for example, a cumulative film thickness value which is detected by a film thickness detector installed within the processing chamber 29 formed by a process tube as a reaction tube, or an estimated film thickness value which is inferred from a use frequency or a use time of the processing chamber 29 in the film forming step. That is to say, at least one setting parameter selected from the cumulative film thickness value, the use frequency and the use time of the process tube or the like is compared with a predetermined threshold value, to determine whether it is time for performing a maintenance check by the operation unit 41.

When executing the cleaning step, in the operation unit 41, a maintenance recipe for a cleaning operation to be performed is first read out from the storage unit 43 and is loaded to a memory such as a RAM or the like arranged within the main controller 41. If necessary, an operation instruction is given from the main controller 41 to the process controller 100 or the conveyance controller 110. In such a manner, the cleaning step is executed.

In case of executing the cleaning step, a lower end opening of the manifold is air-tightly closed by, for example, the furnace mouth shutter 31. The inside of the processing chamber 29 is evacuated by a vacuum exhaust device to a predetermined cleaning pressure (or vacuum degree). The inside of the processing chamber 29 is heated by the heater 49 to a predetermined cleaning temperature.

Thereafter, a fluorine-containing gas (e.g., an $F_2$ gas) as a cleaning gas into the processing chamber 29 is started to be supplied while keeping the inside of the processing chamber 29 at the predetermined cleaning temperature and at the predetermined cleaning pressure.

At this time, an $N_2$ gas supplied into the processing chamber 29 serves as a diluting gas that dilutes the $F_2$ gas as the cleaning gas, or a carrier gas that activates diffusion of the $F_2$ gas into the processing chamber 29. A concentration and diffusion speed of the $F_2$ gas can be controlled by adjusting a supply flow rate of the $N_2$ gas.

The $F_2$ gas supplied into the processing chamber 29 moves upward through the processing chamber 29 and flows from an upper end opening of an inner tube into a tubular space. After flowing downward through the tubular space, the $F_2$ gas is discharged from an exhaust pipe. When passing through the processing chamber 29, the $F_2$ gas makes contact with a silicon film or the like accumulated within the processing chamber 29 and removes the silicon film or the like by virtue of a thermochemical reaction. That is to say, the heated and activated $F_2$ gas becomes etching species, thereby etching and removing the silicon film or the like accumulated within the processing chamber 29. If the removal of the silicon film or the like is completed after a predetermined processing time, the valve 48 is closed to stop the supply of the $F_2$ gas into the processing chamber 29.

Figure 8:
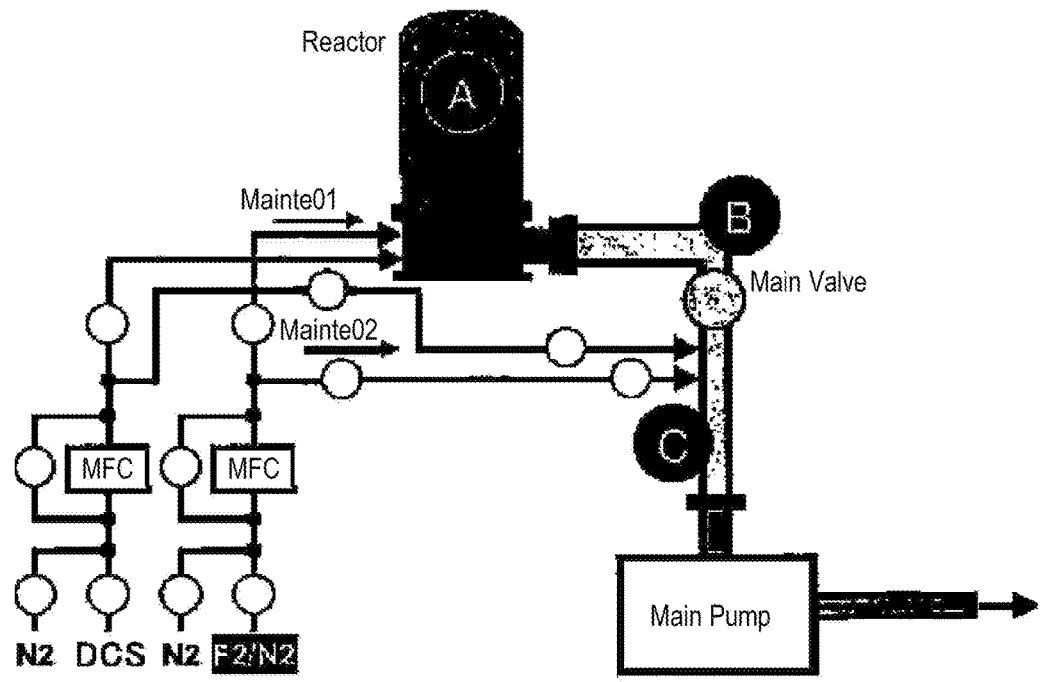
FIG. 8 is a view showing a pipe arrangement of the substrate processing apparatus according to one embodiment of the present disclosure.

FIG. 8 shows details of a gas supply/exhaust pipe system of the substrate processing apparatus according to the present embodiment. As shown in FIG. 8, the gas supply system includes an $F_2$ gas supply line and a DCS ($SiH_2Cl_2$) gas supply line. The $F_2$ gas and the DCS ($SiH_2Cl_2$) gas serve as a cleaning gas and a film forming gas, respectively. Each of the gas supply lines includes a predetermined number of valves, an MFC, a diluting $N_2$ gas line, and a bypass line for supplying a gas to an exhaust side before the gas is supplied into the processing furnace 28 and until a flow rate of the gas is stabilized. An inert gas supply system is also connected to the substrate processing apparatus. The inert gas supply system is not shown because it is not particularly required in describing a maintenance recipe execution control to be described below. An exhaust-side line is configured to include an exhaust pipe and a pressure valve (or main valve) 51. A vacuum exhaust device (or main pump) may be included in the exhaust-side line. As illustrated in FIG. 8, a region A indicates the inside of the processing furnace 28. Regions B and C indicate the exhaust-side line. The region B is located at an upstream side of the pressure valve (or main valve) 51. A pressure of the region B is regulated to a predetermined pressure. The region C is located at a downstream side of the pressure valve (or main valve) 51. The region C is evacuated by the vacuum exhaust device (or main pump) installed at the downstream side. Bypass lines are installed in the $F_2$ gas supply line and the DCS ($SiH_2Cl_2$) gas supply line so that a specified gas can be supplied from a precursor cylinder not shown to region C without flowing through the processing furnace 28.

FIG. 6 shows one example where cleaning recipes (Mainte01 and Mainte02) are prepared as alternative names of a cleaning recipe for removing a deposit adhering to a member constituting an inner part of the processing furnace 28 by supplying a cleaning gas into the processing furnace 28 and an exhaust pipe cleaning recipe for efficiently removing a deposit adhering to the exhaust-side line.

As can be seen from the maintenance recipe names shown in FIG. 6, if Mainte01 is executed, a cleaning gas is supplied to the processing furnace (or reactor) 28 (namely, region A). If Mainte02 is executed, a cleaning gas is directly supplied from the gas supply system to the downstream (or exhaust) side of the pressure valve (or main valve) 51 without flowing through the processing furnace (or reactor) 28. Upon executing Mainte01, the cleaning gas supplied to the processing furnace (reactor) 28 (namely, region A) passes through the exhaust pipe (namely, region B) located between the processing furnace 28 and the pressure valve (or main valve) 51 and passes through the exhaust pipe (namely, region C) located between the pressure valve (or main valve) 51 and the vacuum exhaust device (or main pump). Then, the cleaning gas is discharged from the vacuum exhaust device (or main pump). On the other hand, upon executing Mainte02, the cleaning gas is directly supplied from the gas supply system to region C without flowing through the processing furnace (or reactor) 28. Then, the cleaning gas is discharged from the vacuum exhaust device (or main pump).

EXAMPLE 1

An execution control of a maintenance recipe will be described below with reference to FIGS. 5 and 6. FIG. 5 shows a general process flow of a maintenance recipe in the present embodiment (example 1). In the process flow of example 1, if a process recipe is completed, a current value of a cumulative film thickness is updated. Even before the process recipe is completed, the updating of the current value may be performed as long as a film forming step of the process recipe has been executed. Then, determination is made as to whether a cumulative film thickness value has reached a threshold value at which a maintenance recipe is executed. If the cumulative film thickness value has not yet reached the threshold value, the process flow of the maintenance recipe is terminated. On the other hand, if it is determined that the cumulative film thickness value has reached the threshold value, a maintenance recipe for cleaning (hereinafter sometimes referred to a cleaning recipe) is executed. In this case, once the cleaning recipe is executed and completed, the current value of the cumulative film thickness is cleared. In this way, the maintenance program for executing the present process flow is executed every time the process recipe is executed. Thus, the execution control of the maintenance recipe is performed.

FIG. 6 illustrates a setting table used in the execution control of the maintenance recipe according to the present embodiment (example 1). In the setting table, Mainte02 is a cleaning recipe for removing a deposit adhering to an exhaust pipe by directly supplying a cleaning gas to an exhaust-side line, through which a gas exhausted from the inside of a reactor flows, without flowing through the reactor. The setting table is configured to include an item number "No," which indicates serial numbers allotted to preset maintenance recipes, execution conditions for executing the respective preset maintenance recipes, limit values which indicate threshold values for the respective execution conditions, and maintenance recipe names which indicate names of the respective maintenance recipes. After the process recipe is executed, the setting table is read out by the operation unit 41 at which the execution of the flow shown in FIG. 5 is started (or during the maintenance recipe control process step). In the present embodiment (example 1), the conditions for executing the maintenance recipes include not only the cumulative film thickness value but also the use frequency and the use time.

(Effects of Example 1)

As described above, in the present embodiment (example 1), Mainte01 and Mainte02 are controlled independently from each other. Thus, even before the thickness of the cumulative film deposited within the reactor reaches a threshold value, the cleaning of the exhaust-side line can be performed by executing Mainte02. Since the cleaning gas can be directly supplied to the exhaust-side line without supplying the cleaning gas into the reactor, it is possible to perform a process (e.g., deactivating process) for changing the composition of a Si compound adhering to the exhaust-side line. For example, if a Si compound remaining in the exhaust-side line is exposed to an air atmosphere due to the evacuation performed by the vacuum pump (or vacuum exhaust device) or due to the dismantlement of the exhaust-side line during a maintenance work, there is a fear that the Si compound may explode. With the configuration of the present embodiment, it is possible to avoid the danger of an explosion. Moreover, if the Si compound adheres to and remains in the exhaust-side line, it is sometimes the case that the vacuum pump (or vacuum exhaust device) is interlocked and stopped for safety purposes. Even when such an interlock occurs, the vacuum pump (or vacuum exhaust device) can be safely operated again by executing Mainte02 and performing the deactivating process.

Figure 7:
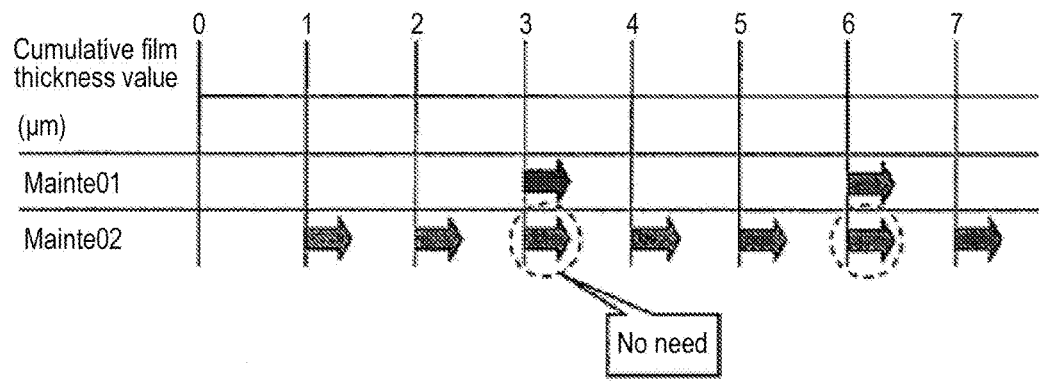
FIG. 7 is a view showing an execution timing chart of maintenance recipes according to one embodiment (example 1) of the present disclosure.

FIG. 7 is a view showing an execution timing chart of the maintenance recipes. As shown in FIG. 7, there may be a case where the execution conditions of Mainte01 and Mainte02 are met at the same time. In this case, if Mainte01 is executed, the cleaning gas defined in the recipe flows from a cleaning gas supply line to the exhaust-side line through the processing furnace 28. In such a manner, in reality, the cleaning of the exhaust-side line is performed at the same time. Thereafter, Mainte02 is executed subsequent to Mainte01. Accordingly, depending on a material of an exhaust-side pipe, there may be a case where the pipe is damaged due to excessive etching. As can be noted from the foregoing, if the maintenance recipes are individually prepared depending on different cleaning conditions (e.g., the cleaning location, the cleaning timing, and the like) in order to efficiently remove the cumulative film, the reliability of the substrate processing apparatus may be reduced to the contrary.

EXAMPLE 2

Example 2 which improves example 1 so as to perform a suitable maintenance recipe execution control even when the execution conditions of Mainte01 and Mainte02 (the respective cleaning recipes) are met at the same time will now be described with reference to FIGS. 9 and 10.

Figure 9:
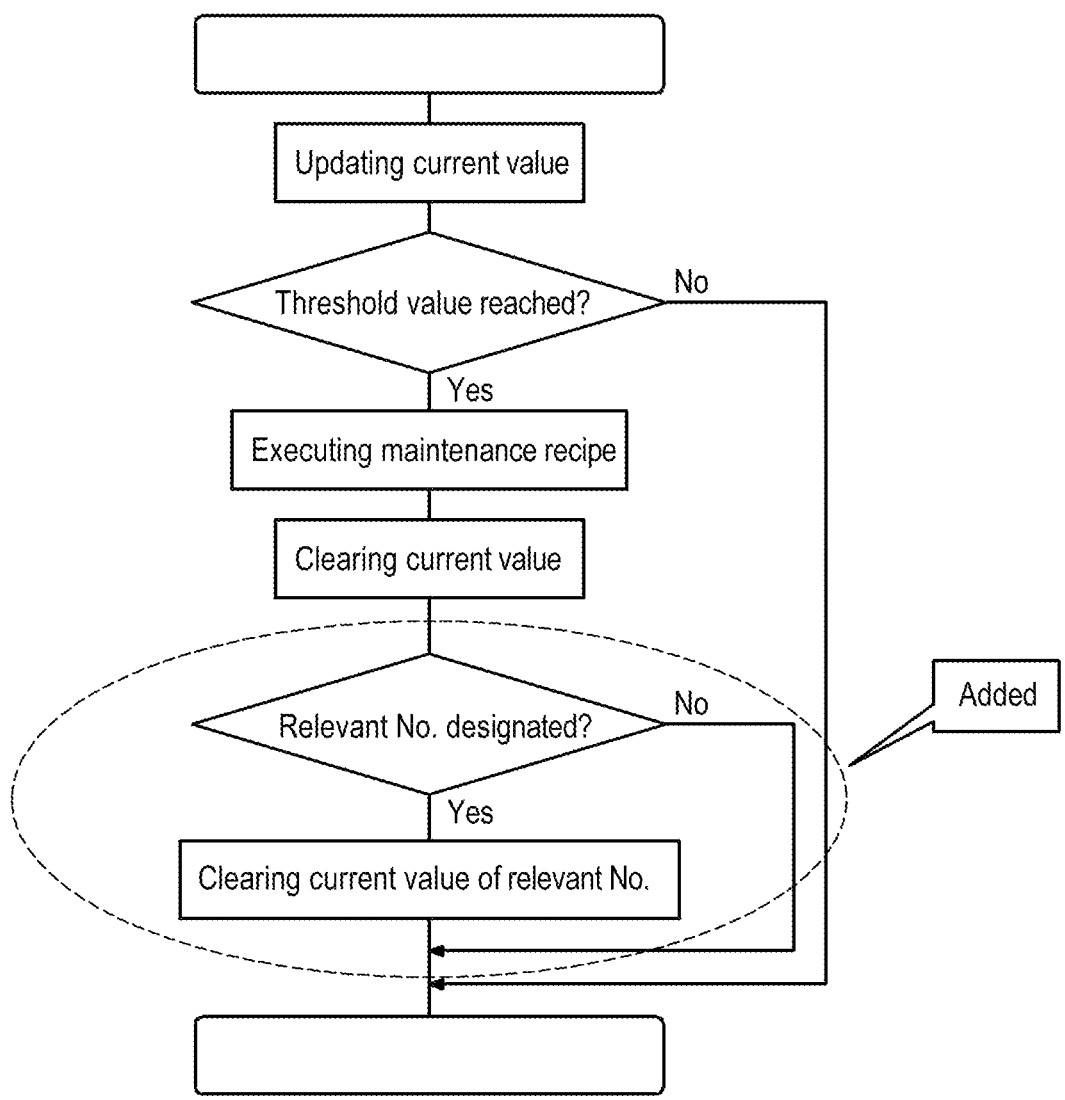
FIG. 9 is a view showing a maintenance recipe control flow according to one embodiment (example 2) of the present disclosure.
Figure 10:
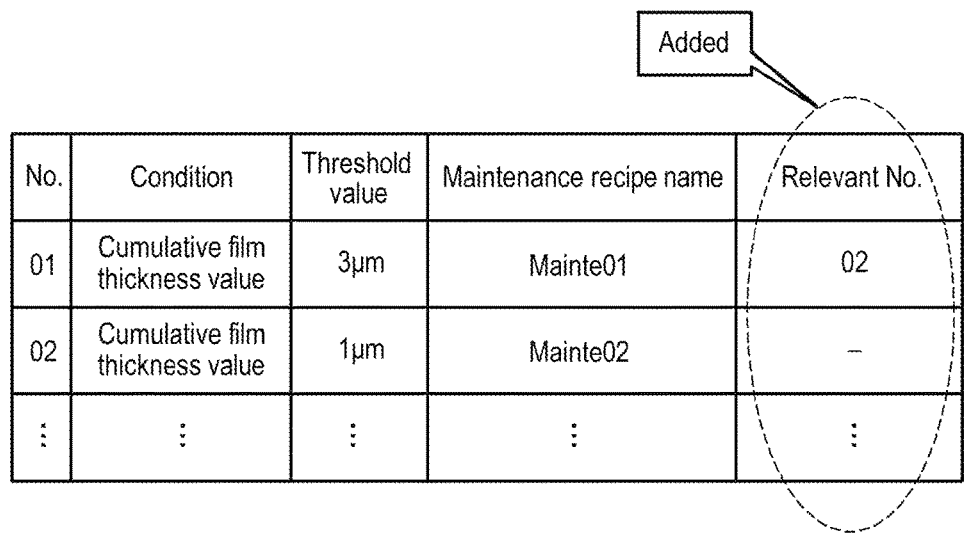
FIG. 10 is a view showing an exemplary screen for setting maintenance recipes according to one embodiment (example 2) of the present disclosure.

FIG. 9 shows a process flow of maintenance recipes according to the present embodiment (example 2). FIG. 10 is a view showing one example of a setting screen according to the present embodiment (example 2). A maintenance program as a recipe control program reads out a setting table shown in FIG. 10, whereby the process flow shown in FIG. 9 is executed.

First, it is determined whether a cumulative film thickness has reached a threshold value. If the cumulative film thickness has not reached the threshold value, the process flow is terminated. On this point, the process flow of example 2 is identical with the process flow of example 1. If the cumulative film thickness has reached the threshold value, the maintenance recipe (or cleaning recipe) is executed. In this case, after the maintenance recipe is executed and completed, the current value of the cumulative film thickness is cleared. Up to this point, the process flow of example 2 is identical with the process flow of example 1.

Then, it is also determined whether there exists a maintenance recipe which is designated as being related to the executed maintenance recipe (or cleaning recipe). If a relevant maintenance recipe exists, a current value of the cumulative film thickness is cleared with respect to the designated maintenance recipe.

Figure 11:
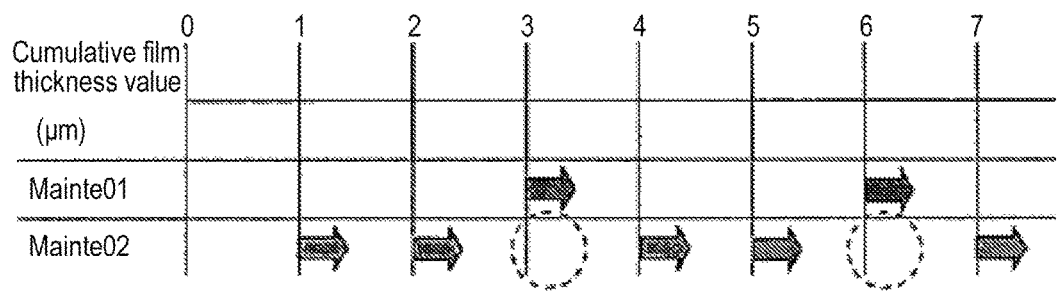
FIG. 11 is a view showing an execution timing chart of maintenance recipes according to one embodiment (example 2) of the present disclosure.

For example, if the current value of the cumulative film thickness of Mainte01 has reached the threshold value, Mainte01 is executed. Then, the current value is cleared. Subsequently, it is determined whether a related maintenance recipe exists. In this case, Mainte02 is designated as the related maintenance recipe. Accordingly, the current value of the cumulative film thickness of Mainte02 is also cleared. If a related maintenance recipe has not been designated, information of the next record is read out while not shown in FIG. 10. In such a manner, the current value of the cleaning recipe that fails to meet the designated maintenance condition is cleared to zero. Consequently, as shown in FIG. 11, both cleaning recipes are not simultaneously executed even when the cumulative film thickness becomes equal to the least common multiple value of their threshold values.

(Effects of Example 2)

The present embodiment (example 2) provides the following effects as well as the effects of example 1 described above.

According to the present embodiment (example 2), if Mainte01 is executed, the cleaning gas defined in the recipe flows from the cleaning gas supply line to the exhaust-side line through the reactor. For that reason, in reality, the cleaning of the exhaust-side line is performed at the same time. If Mainte02 is subsequently executed, there is a fear that the exhaust-side pipe may be damaged depending a material of the exhaust-side pipe. In the present embodiment (example 2), however, if Mainte01 is executed, the current value of Mainte02 is cleared to zero. It is therefore possible to prevent the pipe from being damaged and to reduce particles from being generated. Furthermore, the maintenance recipe (Mainte01) for processing a member constituting an inner part of the reactor and the maintenance recipe (Mainte02) for cleaning the exhaust-side line are selected so as to efficiently remove the cumulative film. Thus, the optimal maintenance recipe is executed. In addition, it is possible to enhance the reliability of the substrate processing apparatus, which may be caused when the maintenance recipes are individually prepared depending on the different cleaning conditions (e.g., the cleaning location, the cleaning timing, and the like.).

In the aforementioned embodiment, a case where the processing operation of the substrate processing apparatus 1 is controlled by the apparatus controller 37 was taken as an example. However, the control function of the main controller 41 can be implemented by a specified program that allows a computer to serve as the control unit (or control means) and the operation unit 41 (or operation means). In the present embodiment, various kinds of programs such as a process execution program and a conveyance program are installed in, e.g., a storage unit of the main controller 41. Prior to the installation, the programs may be provided through a communication line connected to the main controller 41. Alternatively, the programs may be stored in a storage medium readable by the main controller 41 via the port 40 and then provided thereto.

For example, the aforementioned embodiment may be applied to a case where the maintenance recipes are executed in a state in which an empty boat not charged with wafers 18 is loaded into the processing furnace 28 or a case where the maintenance recipes are executed in a state in which a boat charged with dummy wafers 18 is loaded into the processing furnace 28.

<Other Embodiments of the Present Disclosure>

While the dichlorosilane ($SiH_2Cl_2$, abbreviation: DCS) gas was illustrated as one example of the silicon-containing gas, the present disclosure is not limited thereto. For example, it may be possible to use: other chlorosilane such as monochlorosilane ($SiH_3Cl$, abbreviation: MCS), hexachlorodisilane ($Si_2Cl_6$, abbreviation: HCDS), tetrachlorosilane ($SiCl_4$, abbreviation: STC) or trichlorosilane ($SiHCl_3$, abbreviation: TCS); an inorganic raw material such as trisilane ($Si_3H_8$, abbreviation: TS), disilane ($Si_2H_6$, abbreviation: DS) or monosilane ($SiH_4$, abbreviation: MS); and an organic raw material such as aminosilane-based tetrakis(dimethylamino)silane ($Si[N(CH_3)_2]_4$, abbreviation: 4DMAS), tris(dimethylamino)silane ($Si[N(CH_3)_2]_3H$, abbreviation: 3DMAS), bis(diethylamino)silane ($Si[N(C_2H_5)_2]_2H_2$, abbreviation: 2DEAS) or bis(tertiarybutylamino)silane ($SiH_2[NH(C_4H_9)]_2$, abbreviation: BTBAS).

While the fluorine ($F_2$) gas was illustrated as one example of the cleaning gas, the present disclosure is not limited thereto. It may be possible to use halogen-containing gases containing halogen such as fluorine (F) or chlorine (Cl), e.g., a hydrogen fluoride (HF) gas, a chlorine trifluoride ($ClF_3$) gas and a nitrogen trifluoride ($NF_3$) gas. The combination of these gases may also be used.

While the processing furnace 28 according to the present disclosure is configured by a batch-type apparatus that processes a plurality of wafers 18 at one time, the present disclosure is not limited thereto. The present disclosure may be applied to a single-substrate-type apparatus that processes a single wafer 18 at one time.

In the aforementioned embodiment, a case where the substrate to be processed is a semiconductor wafer was taken as an example. However, the present disclosure is not limited thereto. The present disclosure may be properly applied to a substrate processing apparatus that processes a glass substrate such as an LCD (Liquid Crystal Display) panel or the like.

In the aforementioned embodiment, the film forming process was taken as one example of the process implemented by the substrate processing apparatus 1. However, the present disclosure is not limited thereto. That is to say, the process implemented by the substrate processing apparatus 1 may be a process for forming an oxide film or a nitride film, or a process for forming a film containing a metal. Moreover, the detailed content of the substrate processing does not matter. The present disclosure may be properly applied not only to the film forming process but also to other substrate processing processes such as an annealing process, an oxidizing process, a nitriding process, a diffusing process and a lithography process. In addition, the present disclosure may be properly applied to other substrate processing apparatuses such as an annealing apparatus, an oxidizing apparatus, a nitriding apparatus, an exposure apparatus, a coating apparatus, a drying apparatus, a heating apparatus and a CVD apparatus using plasma.

Next, other preferred embodiments of the present disclosure will be additionally stated. It goes without saying that the present disclosure is not limited to the following description.

[Supplementary Note 1]

According to one aspect of the present disclosure, there is provided a substrate processing apparatus, including: a storage unit configured to store a plurality of recipes including a recipe for processing a member (e.g., a reaction tube, a substrate holder or the like) constituting an inner part of a reactor in which substrate processing is performed and a recipe for processing an exhaust pipe through which a gas exhausted from the reactor flows; an operation unit including a display unit configured to display a setting condition for executing the recipes on an operation screen; and a control unit configured to execute a recipe that meets the setting condition, wherein the operation unit includes a recipe control unit configured to select, based on the setting condition, one of the recipe for processing the member constituting the inner part of the reactor in which the substrate processing is performed and the recipe for processing the exhaust pipe, among the recipes stored in the storage unit, and to control execution of the selected recipe.

[Supplementary Note 2]

There is provided the apparatus of Supplementary Note 1, wherein an item indicating relevance between the recipes is defined in the setting condition, and wherein the recipe control unit is configured to clear a condition value defined in the setting condition after the selected recipe is executed, if a designated recipe exists in the item and even if the designated recipe does not meet the setting condition.

[Supplementary Note 3]

There is provided the apparatus of Supplementary Note 1 or 2, wherein the recipes includes a process recipe for processing a substrate, a maintenance recipe for processing a member (e.g., a reaction tube, a substrate holder or the like) constituting an inner part of a reactor in which the substrate is processed, and a maintenance recipe for processing an exhaust pipe through which a gas exhausted from the reactor flows.

[Supplementary Note 4]

According to another aspect of the present disclosure, there is provided a method of controlling a substrate processing apparatus that includes a storage unit configured to store a plurality of recipes including a recipe for processing a member (a reaction tube, a substrate holder or the like) constituting an inner part of a reactor in which substrate processing is performed and a recipe for processing an exhaust pipe through which a gas exhausted from the reactor flows, an operation unit including a display unit configured to display a setting condition for executing the recipes on an operation screen, and a control unit configured to execute a recipe that meets the setting condition, wherein the operation unit includes a recipe control unit configured to control, based on the setting condition, execution of each of the recipe for processing the member constituting the inner part of the reactor in which the substrate processing is performed and the recipe for processing the exhaust pipe, among the recipes stored in the storage unit.

[Supplementary Note 5]

According to a further aspect of the present disclosure, there is provided a substrate processing apparatus, including: a storage unit configured to store a plurality of recipes including a process recipe for processing a substrate, a maintenance recipe for processing a member (e.g., a reaction tube, a substrate holder or the like) constituting an inner part of a reactor in which the substrate is processed and a maintenance recipe for processing an exhaust pipe through which a gas exhausted from the reactor flows; an operation unit including a display unit configured to display a setting condition for executing the maintenance recipe on an operation screen; and a control unit configured to execute a recipe that meets the setting condition, wherein the operation unit includes a recipe control unit configured to compare a current value of an updated condition (e.g., cumulative film thickness value) defined in the setting condition with a threshold value defined in the setting condition after execution of the process recipe is finished, to execute, based on a comparison result, one maintenance recipe which has reached the threshold value, among maintenance recipes stored in the storage unit, and to clear the current value of the executed maintenance recipe.

[Supplementary Note 6]

There is provided the apparatus of Supplementary Note 5, wherein an item indicating relevance between the maintenance recipes is defined in the setting condition, and wherein the recipe control unit is configured to clear a condition (e.g., cumulative film thickness value) defined in the setting condition after the maintenance recipe reaching the threshold value is executed, if a designated maintenance recipe exists in the item and even if the designated maintenance recipe has not reached the threshold value.

[Supplementary Note 7]

According to a still further aspect of the present disclosure, there is provided a recipe control program which includes a step of updating a condition (e.g., cumulative film thickness value) defined in a setting condition for executing maintenance recipes, a step of comparing a current value of the updated condition (e.g., cumulative film thickness value) with a threshold value defined in the setting condition, a step of executing, based on a comparison result, a maintenance recipe which has reached the threshold value, among the maintenance recipes stored in a storage unit, and a step of clearing the current value of the executed maintenance recipe.

[Supplementary Note 8]

There is provided the recipe control program of Supplementary Note 7, wherein, in the step of clearing the current value, a current value of a condition (e.g., cumulative film thickness value) defined in the setting condition for a designated maintenance recipe having relevance with the executed maintenance recipe is cleared even if the current value of the designated maintenance recipe has not reached the threshold value.

[Supplementary Note 9]

According to a yet still further aspect of the present disclosure, there is provided a semiconductor device manufacturing method including a substrate processing step in which a substrate is processed by executing a process recipe and a maintenance step in which maintenance recipes are executed, wherein the maintenance step includes a step of updating a condition (e.g., cumulative film thickness value) defined in a setting condition for executing the maintenance recipes, a step of comparing a current value of the renewed condition (e.g., cumulative film thickness value) with a threshold value defined in the setting condition, a step of selecting, based on a comparison result, a maintenance recipe which has reached the threshold value, among the maintenance recipes stored in a storage unit, and a step of clearing the current value after the selected maintenance recipe is executed.

[Supplementary Note 10]

According to an even yet still further aspect of the present disclosure, there is provided a substrate processing apparatus maintaining method including at least a maintenance step in which cleaning is performed by executing maintenance recipes, wherein the maintenance step includes a step of updating a condition (e.g., cumulative film thickness value) defined in a setting condition for executing the maintenance recipes, a step of comparing a current value of the renewed condition (e.g., cumulative film thickness value) with a threshold value defined in the setting condition, a step of selecting, based on a comparison result, a maintenance recipe which has reached the threshold value, among the maintenance recipes stored in a storage unit, and a step of clearing the current value after the selected maintenance recipe is executed.

[Supplementary Note 11]

According to an additional aspect of the present disclosure, there is provided a method of maintaining a substrate processing apparatus that includes a control unit configured to execute maintenance recipes including a recipe for processing a member constituting an inner part of a reactor in which substrate processing is performed and a recipe for processing an exhaust pipe through which a gas exhausted from the reactor flows, wherein the control unit is configured to execute a recipe control program that includes a step of updating a condition defined in a setting condition for executing the maintenance recipes, a step of comparing a current value of the renewed condition (e.g., cumulative film thickness value) with a threshold value defined in the setting condition, a step of selecting, based on a comparison result, a maintenance recipe which has reached the threshold value, among the maintenance recipes stored in a storage unit, and a step of clearing the current value after the selected maintenance recipe is executed.

[Supplementary Note 12]

According to a further additional aspect of the present disclosure, there is provided a computer-readable recording medium which records a recipe control program that includes a step of updating a condition (e.g., cumulative film thickness value) defined in a setting condition for executing maintenance recipes, a step of comparing a current value of the updated condition (e.g., cumulative film thickness value) with a threshold value defined in the setting condition, a step of executing, based on a comparison result, a maintenance recipe which has reached the threshold value, among the maintenance recipes stored in a storage unit, and a step of clearing the current value of the executed maintenance recipe.

This application is based upon and claims the benefit of priority from Japanese Patent Application No. 2012-082128 filed on Mar. 30, 2012, the entire contents of which are incorporated herein by reference.

INDUSTRIAL USE OF THE PRESENT DISCLOSURE

The present disclosure can be applied to all kinds of substrate processing apparatuses for processing a substrate.

EXPLANATION OF REFERENCE NUMERALS

1: substrate processing apparatus, 18: wafer, 41: operation unit, 44: data storage unit, 55: input unit, 56: display unit

What is claimed is:

1. A substrate processing apparatus, comprising:
a reactor comprising an exhaust pipe;
one or more valves for supplying one or more processing gases to the reactor;
a storage memory device configured to store a plurality of recipes including a recipe for processing a member constituting an inner part of the reactor in which substrate processing is performed and a recipe for processing an exhaust pipe through which a gas exhausted from the reactor flows;
a display device configured to display a setting condition for executing at least one of the plurality of recipes on an operation screen;
a controller processor configured to:
calculate a film thickness value of a cumulative film that is deposited on the member constituting the inner part of the reactor or deposited inside the exhaust pipe;
select one of the plurality of recipes which is determined to meet the setting condition by comparing the calculated film thickness value and a film thickness threshold of the setting condition; and
control the one or more valves to execute the selected recipe,
wherein sequential relevance among the plurality of recipes is defined in the setting condition, and
wherein the controller processor is further configured to:
if a designated recipe that is identified based on the sequential relevance of the selected recipe exists, clear a condition value of the designated recipe regardless of whether the designated recipe meets the setting condition or does not meet the setting condition;
control the one or more valves to execute the designated recipe after executing the selected recipe; and
clear the condition value.

2. The apparatus of claim 1, wherein the plurality of recipes includes a process recipe for processing a substrate and a maintenance recipe for processing the member constituting the inner part of the reactor, in which the substrate is processed, or for processing the exhaust pipe through which the gas exhausted from the reactor flows.

3. The apparatus of claim 2, wherein the maintenance recipe is a cleaning recipe for removing a cumulative film deposited on the member constituting the inner part of the reactor or deposited inside the exhaust pipe.

4. The apparatus of claim 1, wherein the plurality of recipes includes at least an exhaust pipe cleaning recipe for removing a deposit adhering to an exhaust side line, and
wherein a cleaning gas used in the exhaust pipe cleaning recipe changes a composition of the deposit adhering to the exhaust side line.

5. The apparatus of claim 4, wherein the exhaust pipe cleaning recipe is configured to be executed before a thickness of a cumulative film in a processing furnace reaches a threshold value.

6. The apparatus of claim 4, wherein the cleaning gas is a fluorine-containing gas.

7. The apparatus of claim 4, wherein the cleaning gas is a halogen-containing gas that contains at least halogen, which is selected from a group consisting of fluorine (F) and chlorine (Cl).

8. The apparatus of claim 4, wherein the cleaning gas includes at least one of fluorine ($F_2$) gas, hydrogen fluoride (HF) gas, chlorine trifluoride ($CF_3$) gas, and nitrogen trifluoride ($NF_3$) gas.

9. The apparatus of claim 4, wherein the deposit adhering to the exhaust side line is a Si compound.

10. The apparatus of claim 1, wherein the plurality of recipes includes a maintenance recipe executed in a state in which an empty boat not charged with a wafer is loaded into a processing furnace or a maintenance recipe executed in a state in which the boat charged with a dummy wafer is loaded into the processing furnace.

\* \* \* \* \*